United States Patent
Lee et al.

(10) Patent No.: US 9,548,121 B2
(45) Date of Patent: Jan. 17, 2017

(54) MEMORY DEVICE HAVING ONLY THE TOP POLY CUT

(71) Applicant: MACRONIX INTERNATIONAL CO., LTD., Hsin-chu (TW)

(72) Inventors: Chih-Wei Lee, New Taipei (TW); Shaw-Hung Ku, Taipei (TW); Cheng-Hsien Cheng, Puzih (TW)

(73) Assignee: Macronix International Co., Ltd., Hsin-Chu (TW)

( * ) Notice: Subject to any disclaimer, the term of this patent is extended or adjusted under 35 U.S.C. 154(b) by 0 days.

(21) Appl. No.: 14/742,944

(22) Filed: Jun. 18, 2015

(65) Prior Publication Data

US 2016/0372198 A1 Dec. 22, 2016

(51) Int. Cl.
| | | |
|---|---|---|
| *G11C 16/08* | (2006.01) | |
| *G11C 16/04* | (2006.01) | |
| *H01L 27/115* | (2006.01) | |
| *H01L 21/768* | (2006.01) | |

(52) U.S. Cl.
CPC ........... *G11C 16/0483* (2013.01); *G11C 16/08* (2013.01); *H01L 21/76802* (2013.01); *H01L 27/11551* (2013.01); *H01L 27/11578* (2013.01)

(58) Field of Classification Search
CPC ................. G11C 16/0483; G11C 16/08; H01L 27/11551; H01L 21/76802; H01L 27/11578
See application file for complete search history.

(56) References Cited

U.S. PATENT DOCUMENTS

| | | | | |
|---|---|---|---|---|
| 9,219,075 B1* | 12/2015 | Lai | ..................... | H01L 27/11582 |
| 2012/0099387 A1* | 4/2012 | Shim | ........................ | G11C 7/12 |
| | | | | 365/189.05 |
| 2012/0224426 A1* | 9/2012 | Nam | .................. | G11C 16/0483 |
| | | | | 365/185.11 |
| 2012/0284469 A1* | 11/2012 | Seo | ..................... | G06F 12/0246 |
| | | | | 711/159 |
| 2013/0198440 A1* | 8/2013 | Oh | ....................... | G11C 11/5628 |
| | | | | 711/103 |
| 2014/0347927 A1* | 11/2014 | Kim | ........................ | G11C 16/08 |
| | | | | 365/185.11 |

* cited by examiner

*Primary Examiner* — Khamdan Alrobaie
(74) *Attorney, Agent, or Firm* — Alston & Bird LLP

(57) ABSTRACT

Methods and apparatuses are contemplated herein for enhancing the efficiency of nonvolatile memory devices. In an example embodiment, a nonvolatile memory device comprises a substrate and 3D array of nonvolatile memory cells, the 3D array including a plurality of conductive layers, separated from each other by insulating layers, the plurality of conductive layers comprising a top layer, the top layer comprising n string select lines (SSLs) and one or more bottom layers, the top layer further comprises n–1 cuts, each cut electrically separating two SSLs, wherein each cut is cut to a depth of the top layer and not extending into the bottom layers and a plurality of vertical channels arranged orthogonal to the plurality of layers, each of the plurality of channels comprising a string of memory cells, each of plurality of strings coupled to a bit line, an SSL and one or more word lines.

23 Claims, 15 Drawing Sheets

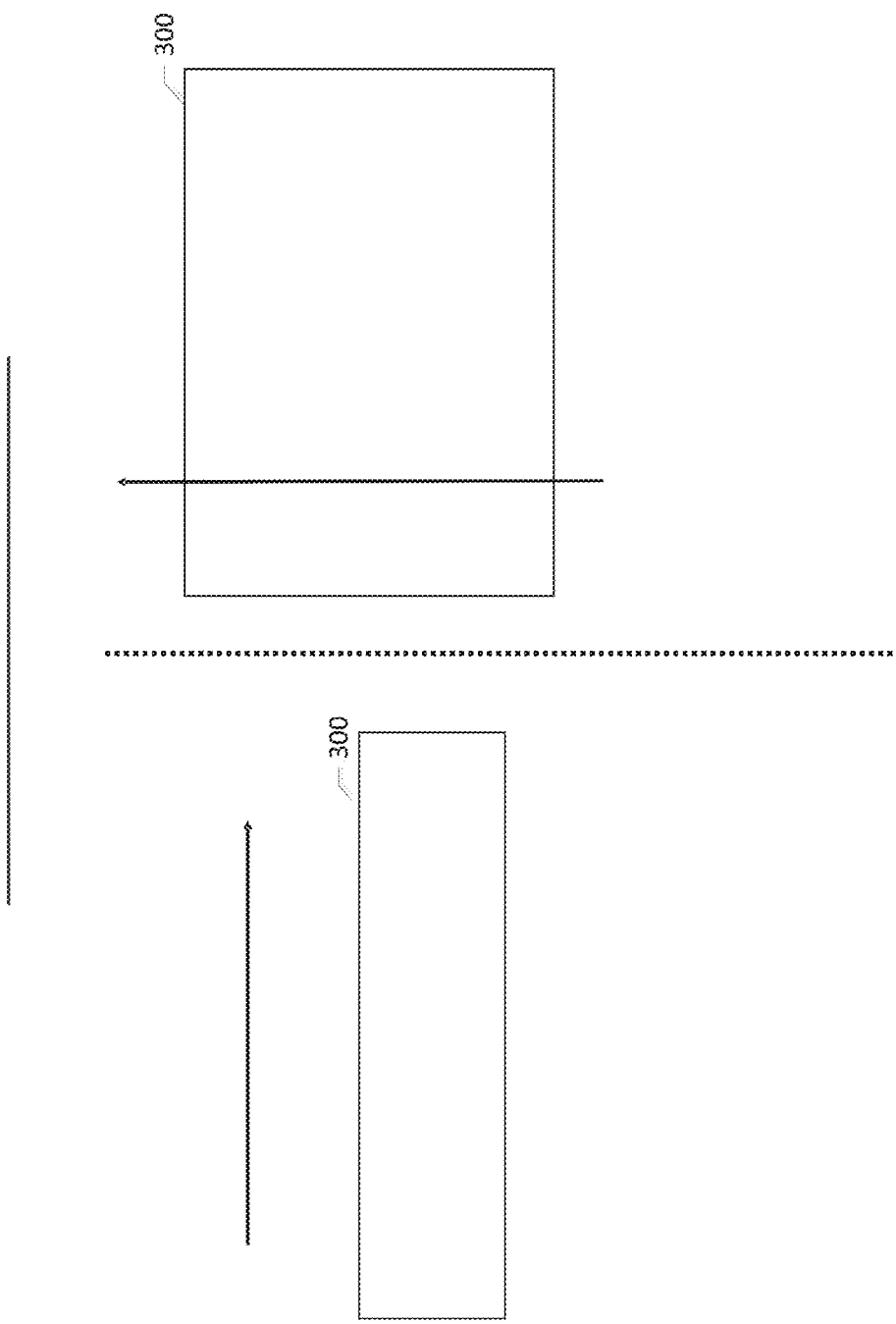

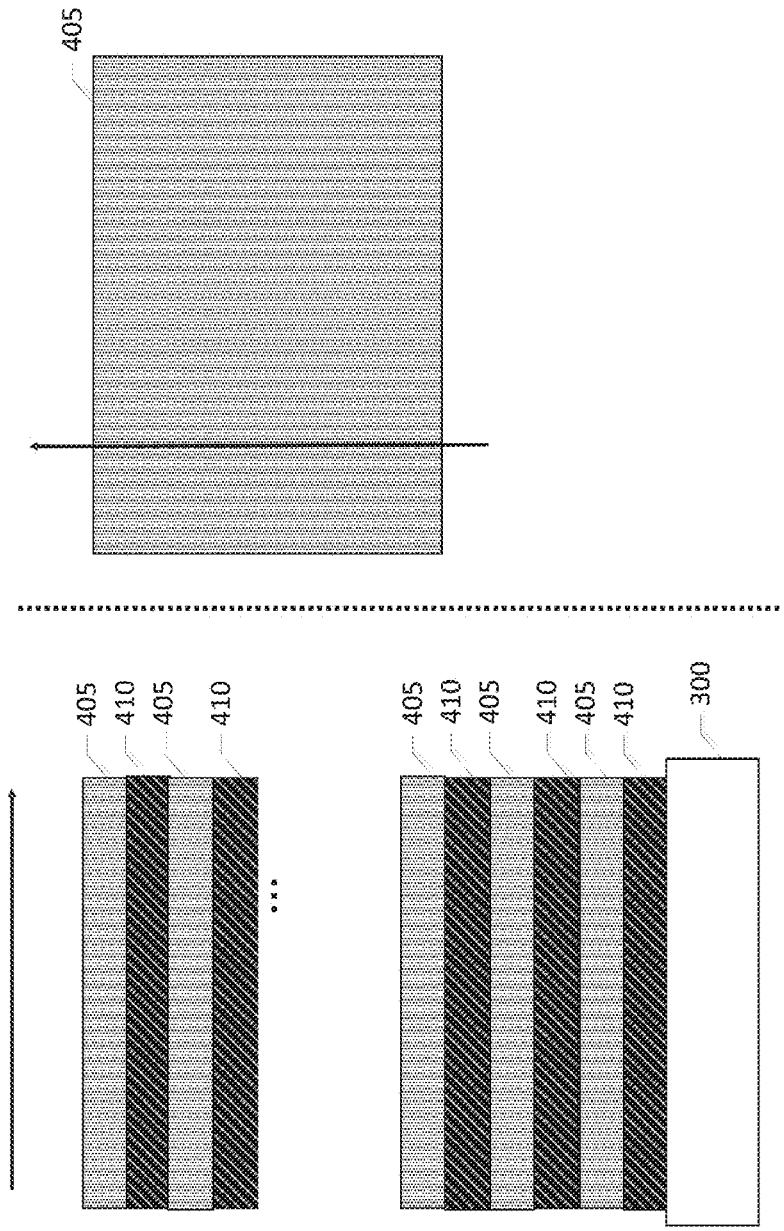

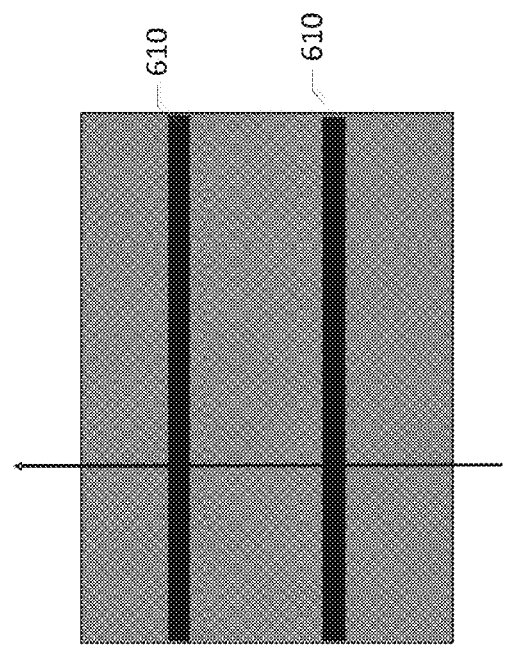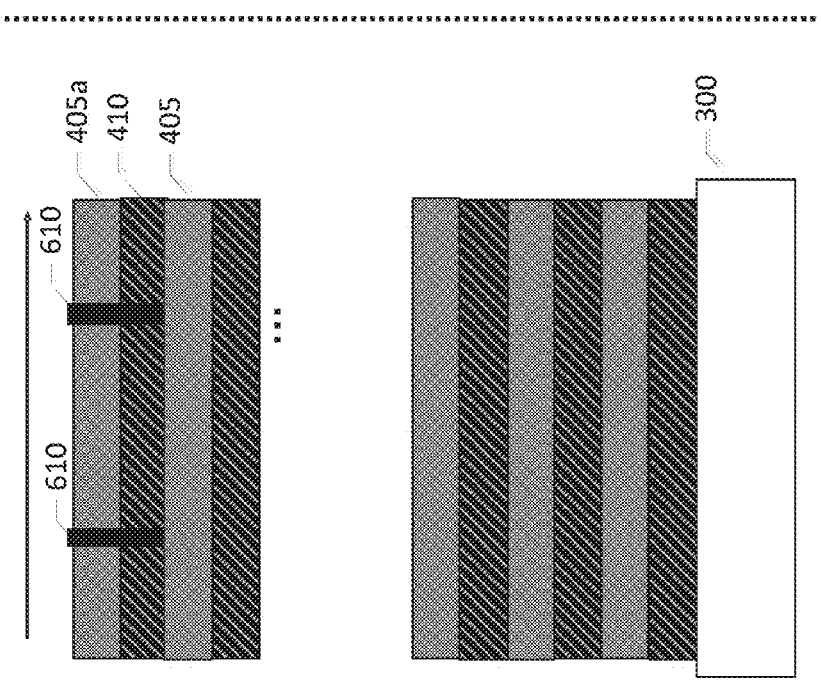
Fig. 6A
Fig. 6B

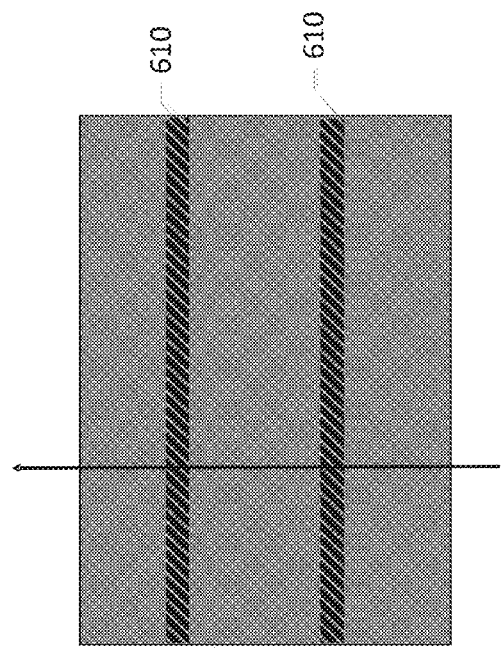
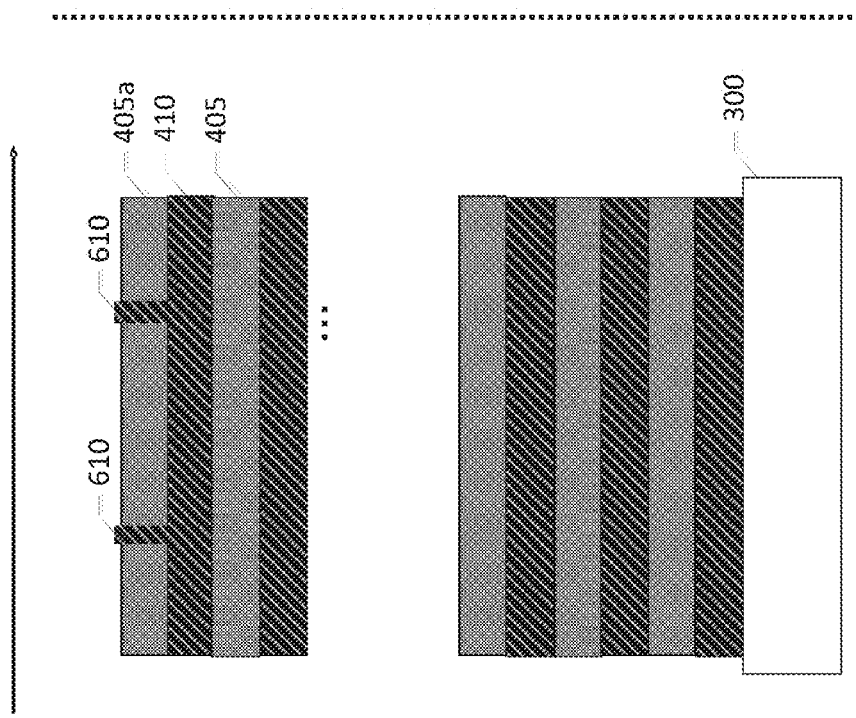
Fig. 7B
Fig. 7A

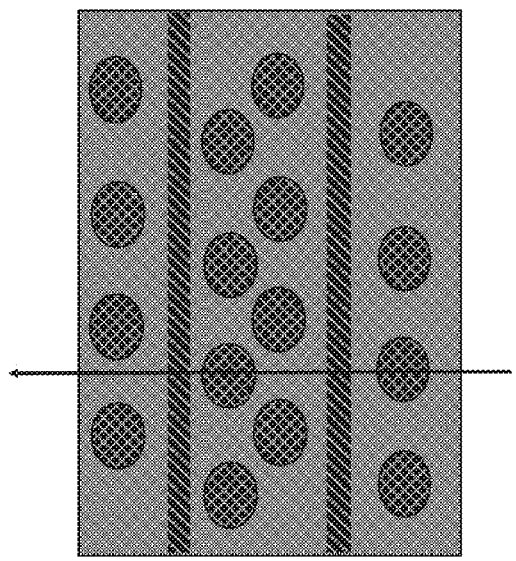
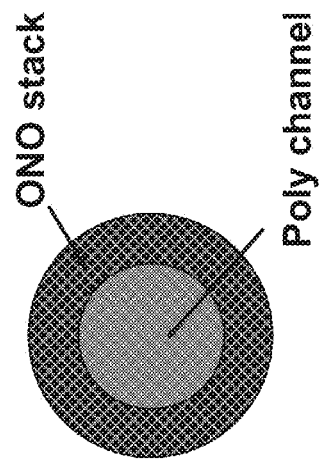
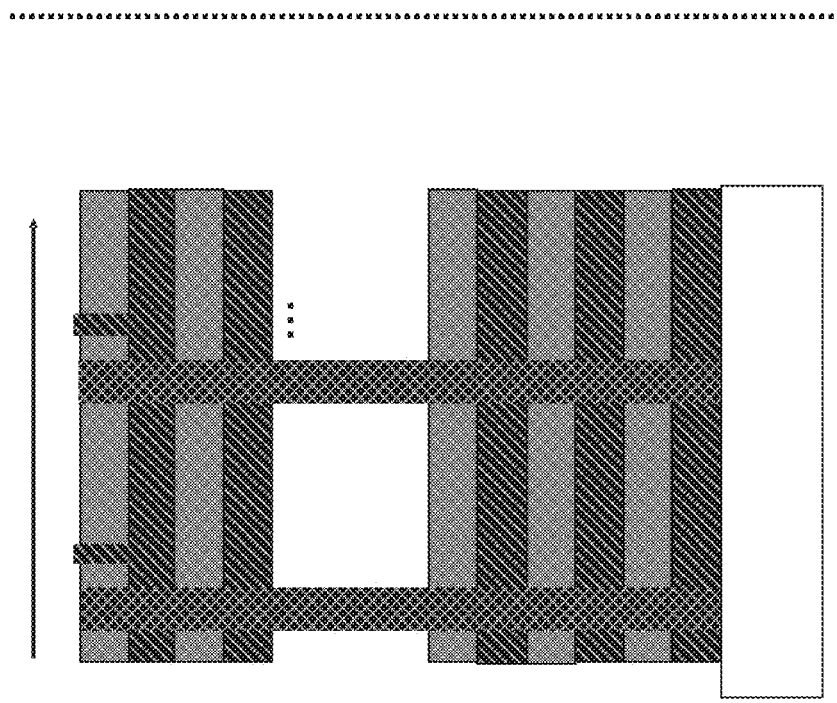

MEMORY DEVICE HAVING ONLY THE TOP POLY CUT

TECHNOLOGICAL FIELD

Example embodiments of the present invention relate generally to non-volatile memory devices and, more particularly, to high density non-volatile memory devices in which multiple planes of memory cells are arranged to provide a three-dimensional vertical array.

BACKGROUND

As scaling challenges are discovered in attempts to integrate more and more transistors onto a single substrate, new technologies are developed. Previously, increases in transistor density were largely achieved by the miniaturization of the transistor itself. However, there is a physical limit to the degree of miniaturization that is possible. In an attempt to continue integrating more transistors on a single device, the concept of vertical devices, also known as 3D devices, has gained momentum. That is, while traditional transistors are made with the source, drain and gate region horizontally oriented, vertical gates build these features in the vertical direction, thereby reducing the horizontal footprint of each device.

Accordingly, 3D NAND structure is proving attractive due to its capability to increase the array density by simply stacking more layers within a similar footprint. As more layers are stacked, the pitch between elements increases thereby also decreasing the number of elements horizontally oriented. As such, the scalability of 3D structure is limited.

Accordingly, there is a need in the art to eliminate the need to perform deep slit etching thus reducing limits in the scalability and efficiency of the 3D structure.

BRIEF SUMMARY OF EXEMPLARY EMBODIMENTS

In accordance with embodiments of the present invention, a nonvolatile memory device is provided that can avoid the inefficiency resulting from tapered etching, by providing a novel 3D structure involving only a top poly cut to bypass process window limitation for higher stacks thus achieving a very efficient array density.

In some embodiments, an apparatus for controlling a memory device may be provided, the apparatus comprising a substrate, and a 3D array of nonvolatile memory cells, the 3D array including a plurality of conductive layers, separated from each other by insulating layers, the plurality of conductive layers comprising a top layer, the top layer comprising n string select lines (SSLs) and one or more bottom layers, wherein the top layer further comprises n−1 cuts, each cut electrically separating two SSLs, wherein each cut is cut to a depth of the top layer thus not extending into the bottom layers.

In some embodiments, the apparatus may further comprise a plurality of vertical channels arranged orthogonal to the plurality of layers, each of the plurality of channels comprising a string of memory cells, each of plurality of strings coupled to a bit line, an SSL and one or more word lines.

In some embodiments, the apparatus may further comprise a control circuit configured to decode bit lines utilizing the SSLs.

In some embodiments, the apparatus may further comprise a common select line (CSL) on each side of the bit lines, wherein the CSL is formed with any one of poly-silicon, epitaxial (Epi), or metal.

In some embodiments, the memory device is one of a non-volatile memory device, an embedded memory device, a floating gate memory device, or a charge trapping memory device. In some embodiments, the substrate is one of an n-type, un-doped, a p-type, or a triple well structure including n-well, p-well, and deep N-well.

In some embodiments, the ONO stack could be any one of an insulator/trapping or trapping/insulator combination and the channel is filled with any one of a poly only or poly/insulator combination.

In some embodiments, the apparatus may be utilized to control a ROM or NAND memory device. In some embodiments, the memory device is a non-volatile memory device comprises a flash memory. In some embodiments, the memory device is a non-volatile memory device comprises a NAND flash memory.

In some embodiments, a non-volatile memory device may be provided comprising a substrate, and 3D array of non-volatile memory cells, the 3D array including a plurality of conductive layers, separated from each other by insulating layers, the plurality of conductive layers comprising a top layer, the top layer comprising n string select lines (SSLs) and one or more bottom layers, wherein the top layer further comprises n−1 cuts, each cut electrically separating two SSLs, wherein each cut is cut to a depth of the top layer thus not extending into the bottom layers, and In some embodiments, the non-volatile memory device may further comprise a plurality of vertical channels arranged orthogonal to the plurality of layers, each of the plurality of channels comprising a string of memory cells, each of plurality of strings coupled to a bit line, an SSL and one or more word lines.

In some embodiments, the non-volatile memory device may further comprise a control circuit configured to decode bit lines utilizing the SSLs.

In some embodiments, the non-volatile memory device may further comprise a common select line (CSL) on each side of the bit lines, wherein the CSL is formed with any one of poly-silicon, Epi, or metal. In some embodiments, the substrate is one of an n-type, un-doped, a p-type, or a triple well structure including n-well, p-well, and deep N-well.

In some embodiments, the ONO stack could be any one of an insulator/trapping or trapping/insulator combination and the channel is filled with any one of a poly only or poly/insulator combination.

In some embodiments, the non-volatile memory device comprising a flash memory. In some embodiments, the non-volatile memory device may comprise a NAND flash memory.

In some embodiments, a method of manufacturing a semiconductor device may be provided, the method comprising providing a substrate, forming a plurality of conductive layers, separated from each other by insulating layers, the plurality of conductive layers comprising a top layer, the top layer comprising n string select lines (SSLs) and one or more bottom layers, etching the top layer to comprise n−1 cuts, wherein each cut is cut to a depth of the top layer and not extending into the bottom layers, and filling the n−1 cuts with insulating material, wherein the etching and filling each cut forms the SSLs along the top layer.

In some embodiments, the method may further comprise providing a plurality of vertical channels arranged orthogonal to the plurality of layers, each of the plurality of channels comprising a string of memory cells, each of plurality of strings coupled to a bit line, an SSL and one or more word lines.

In some embodiments, the method may further comprise decoding one or more bit lines utilizing the SSLs.

In some embodiments, the semiconductor device is one of a non-volatile memory device, an embedded memory device, a floating gate memory device, or a charge trapping memory device.

In some embodiments, the substrate is one of an n-type, un-doped, a p-type, or a triple well structure including n-well, p-well, and deep N-well.

The above summary is provided merely for purposes of summarizing some example embodiments to provide a basic understanding of some aspects of the invention. Accordingly, it will be appreciated that the above-described embodiments are merely examples and should not be construed to narrow the scope or spirit of the invention in any way. It will be appreciated that the scope of the invention encompasses many potential embodiments in addition to those here summarized, some of which will be further described below.

BRIEF DESCRIPTION OF THE SEVERAL VIEWS OF THE DRAWINGS

Figure 1:
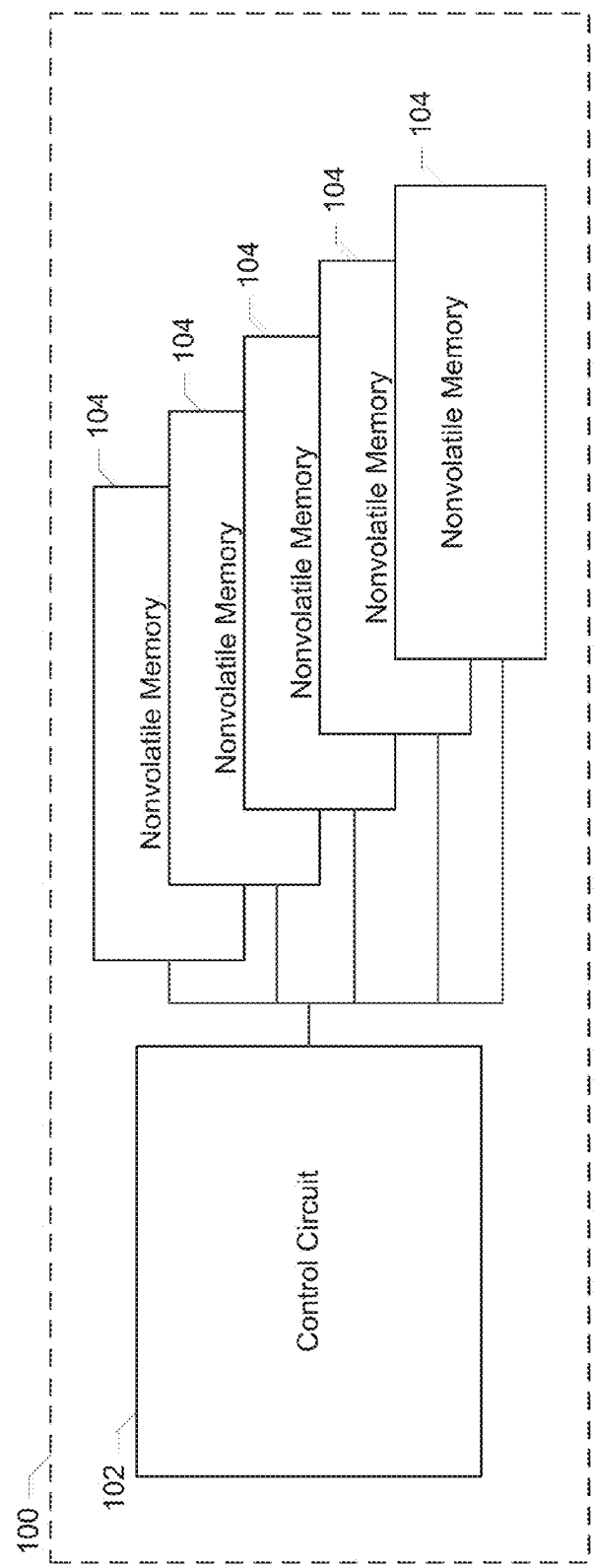
Figure 2B:
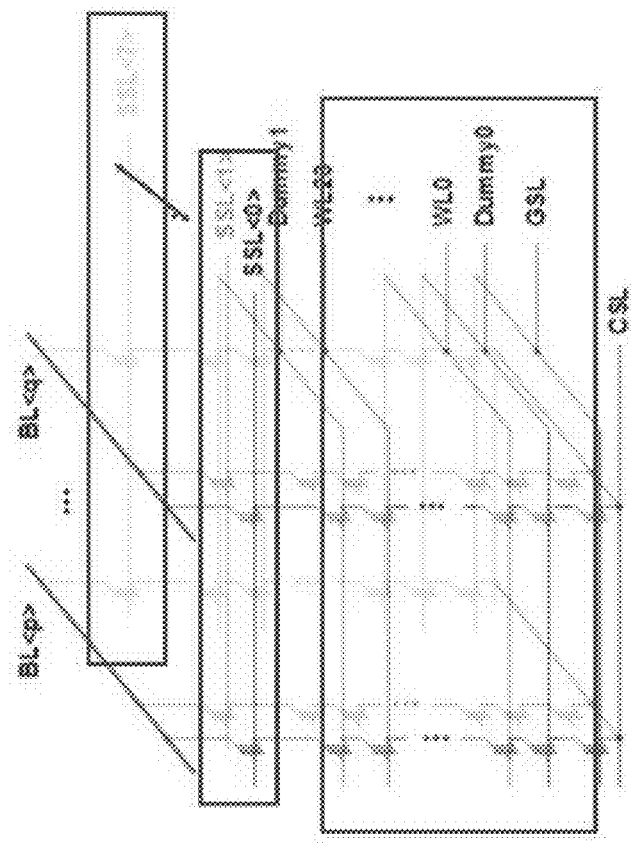
Figure 2A:
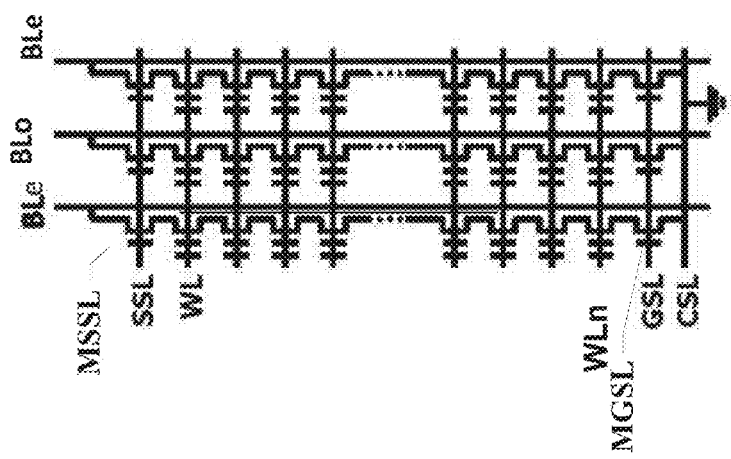
Figure 5:
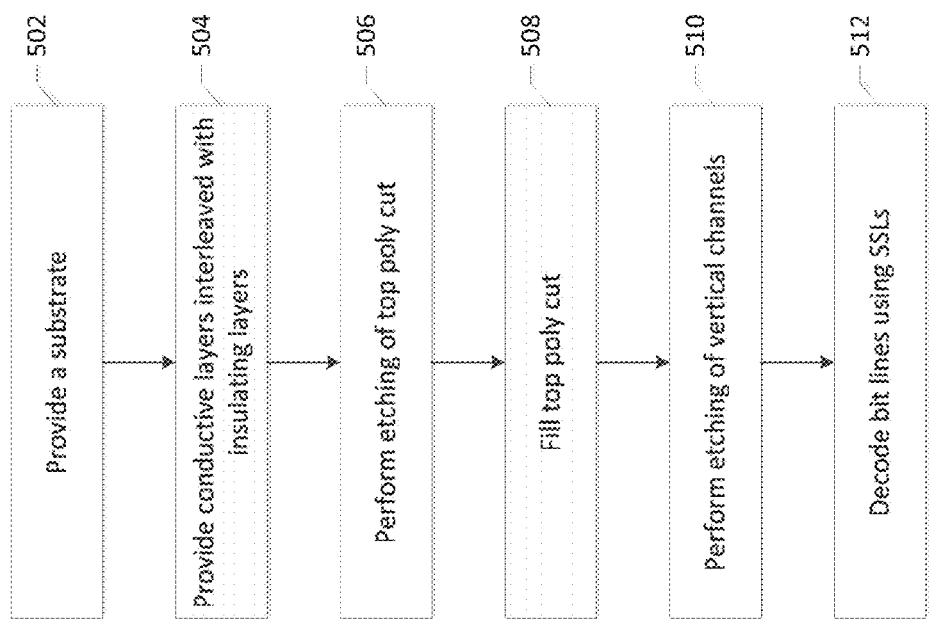
Figure 11B:
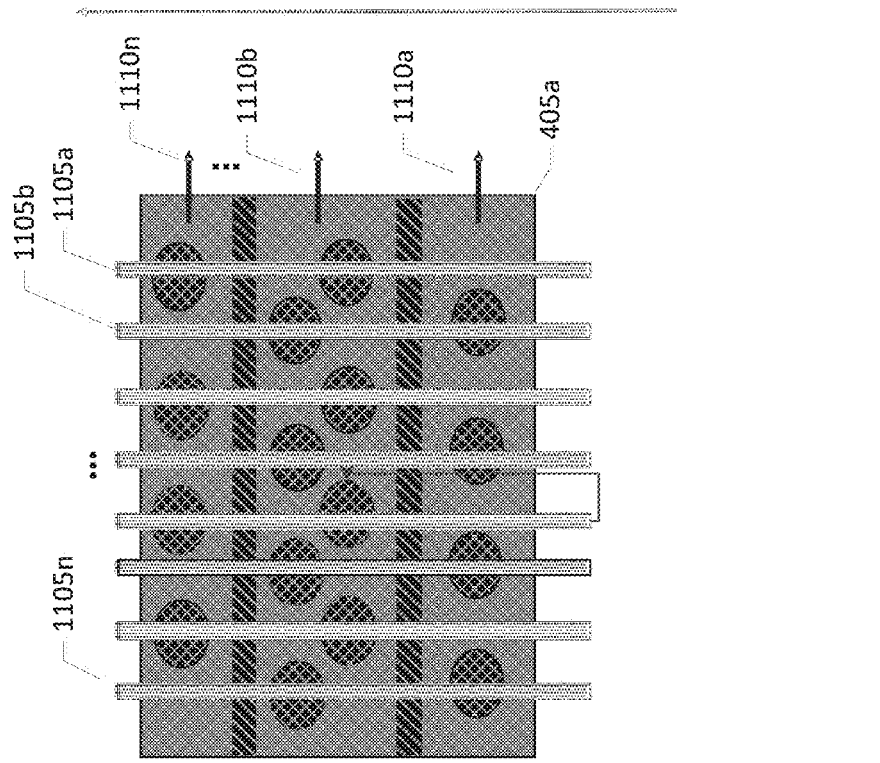
Figure 11A:
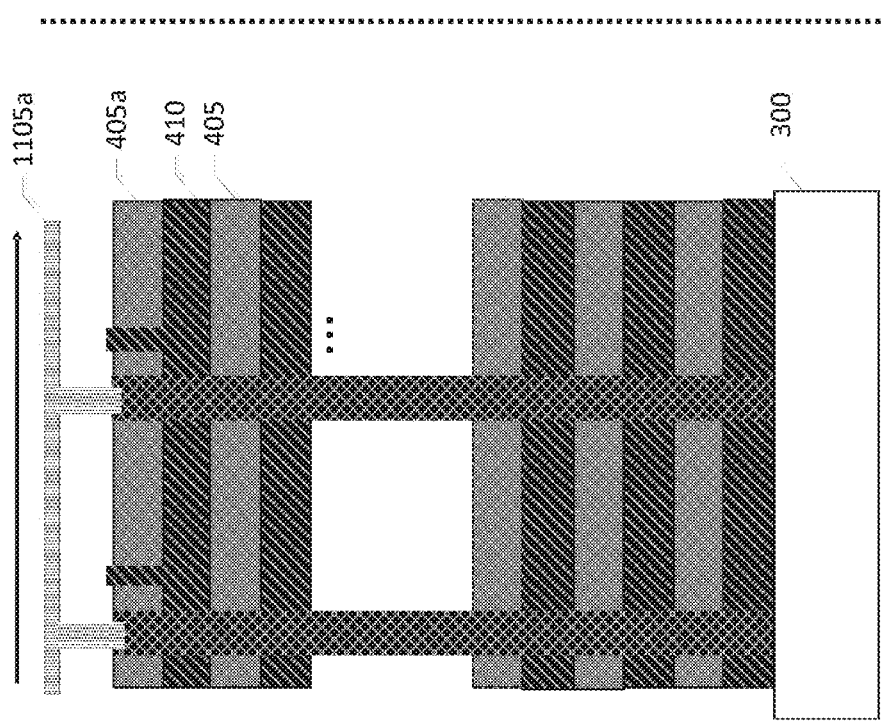
Figures 12A, 12B:
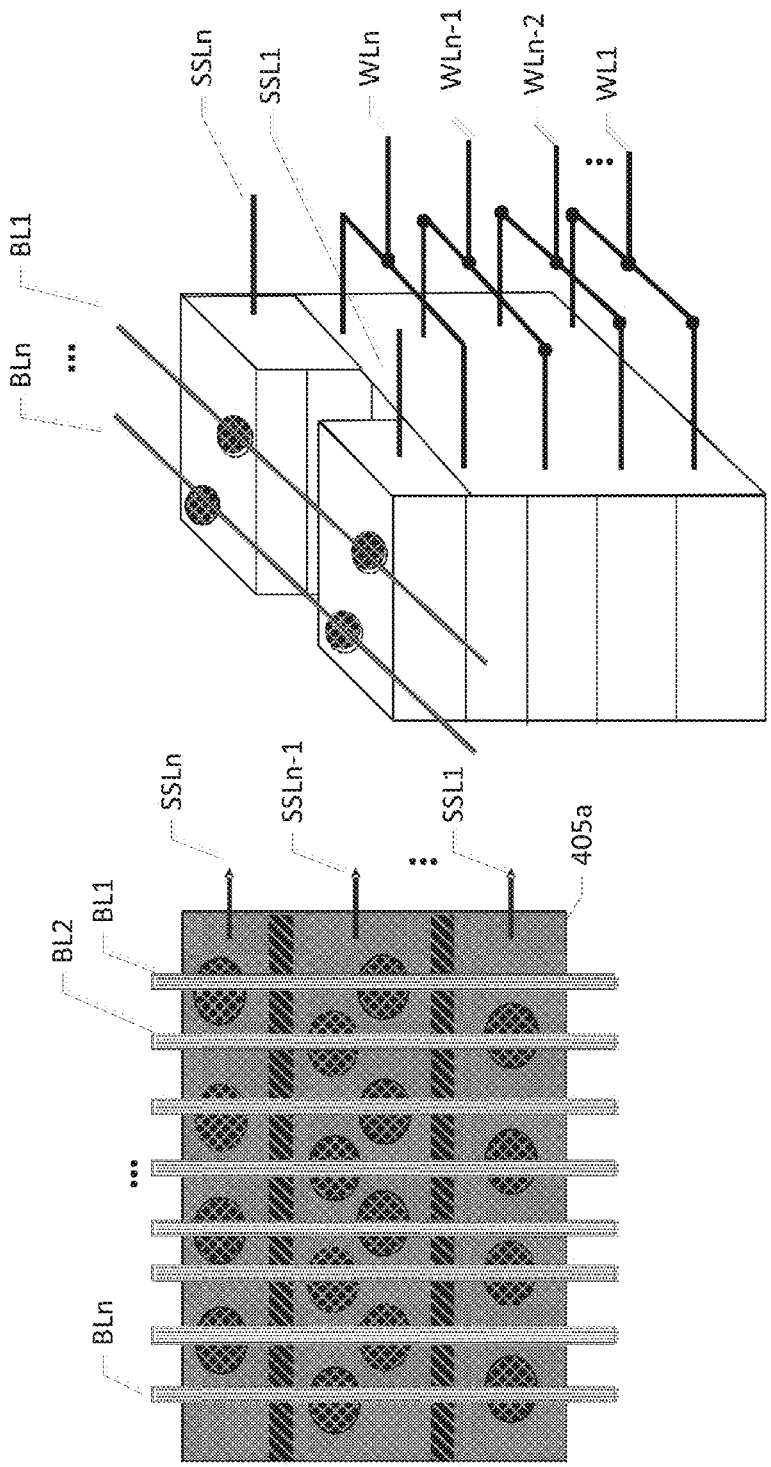
Figure 13:
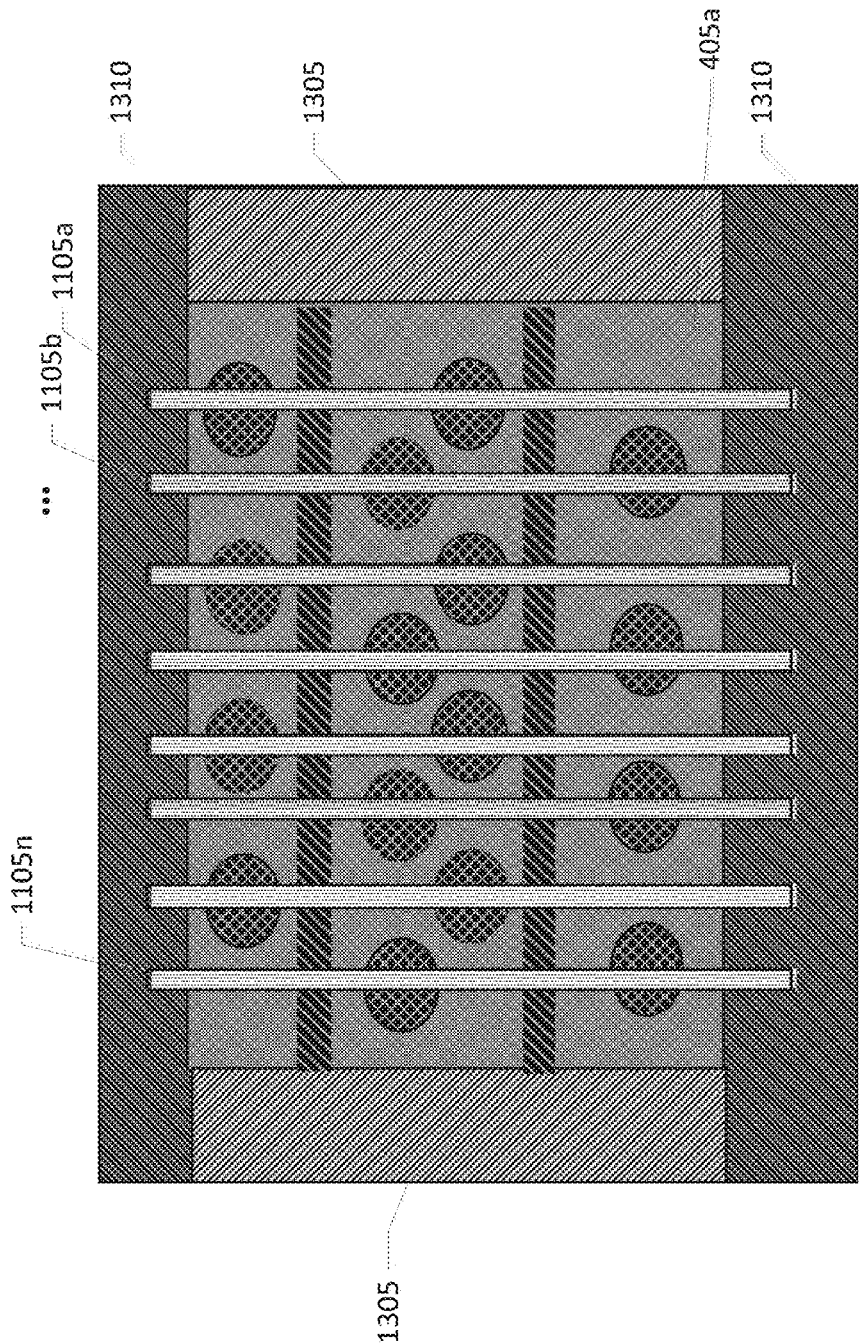
Figure 14:
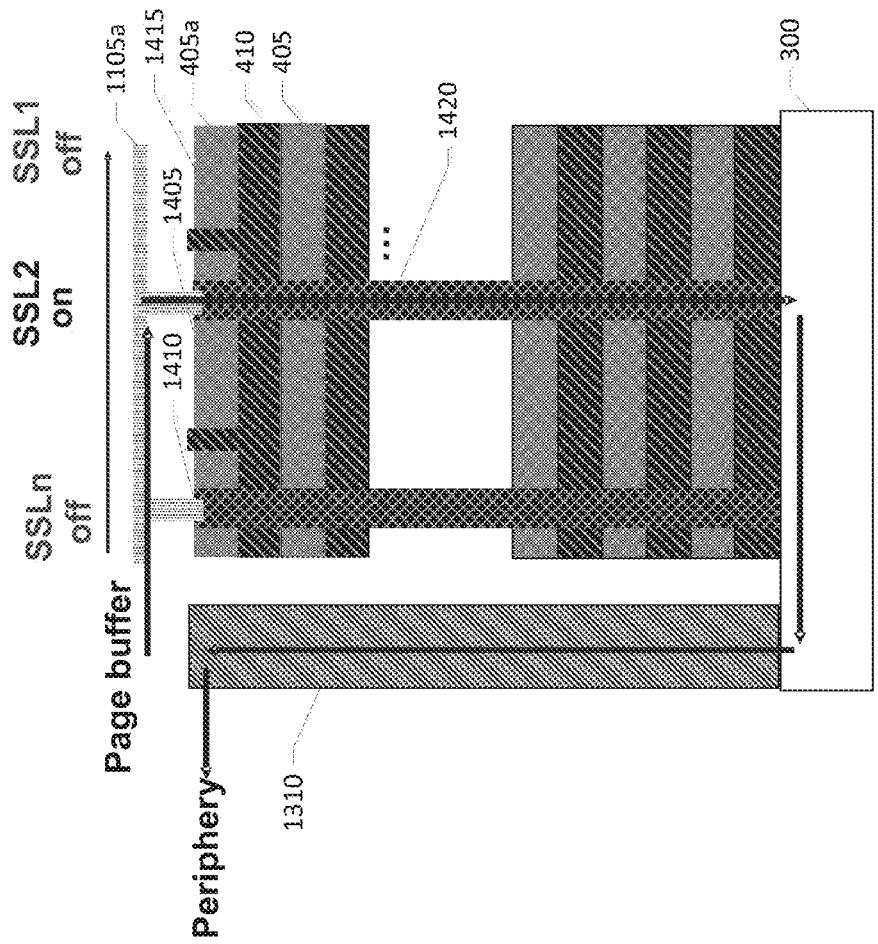
Figures 15A, 15B:
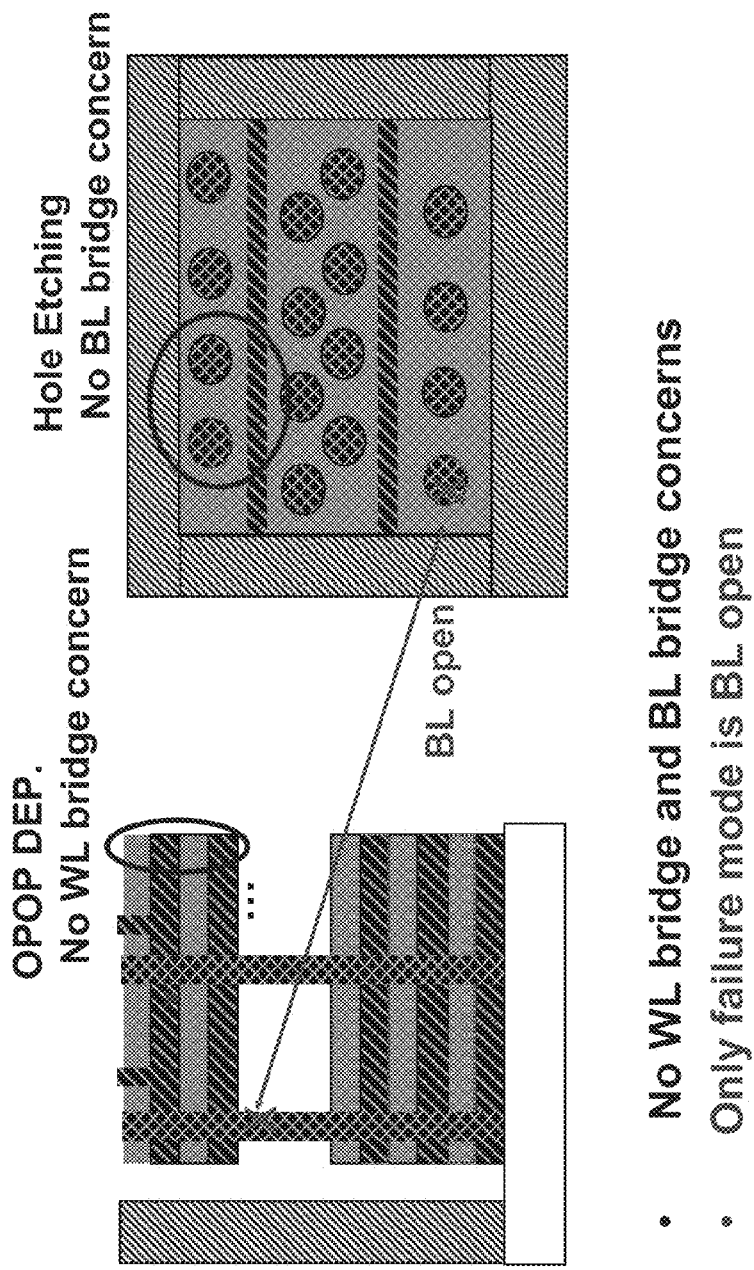
Figure 16B:
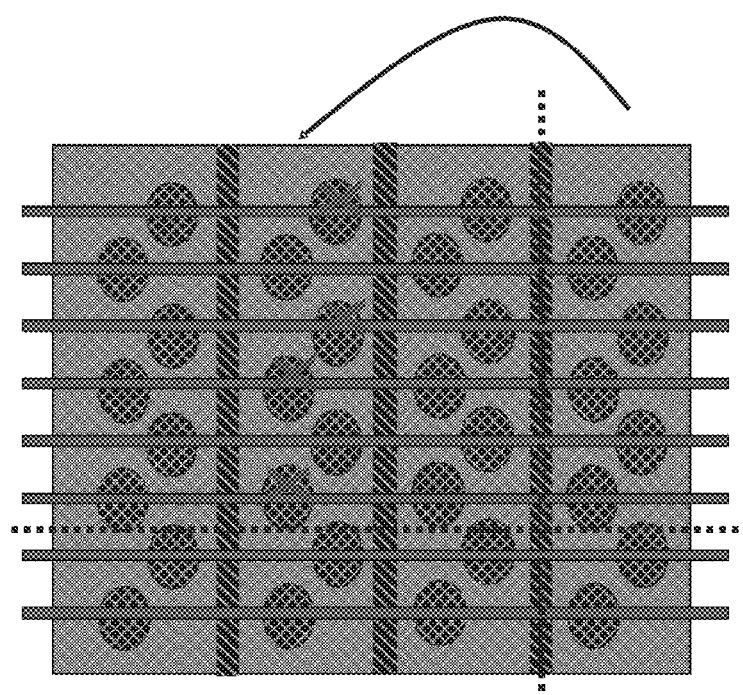
Figure 16A:
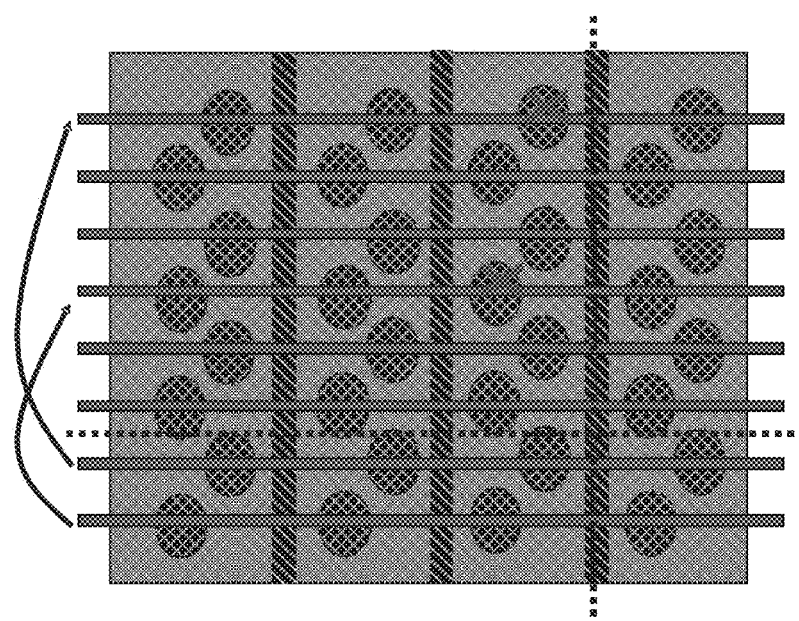

Having thus described certain example embodiments of the present disclosure in general terms, reference will now be made to the accompanying drawings, which are not necessarily drawn to scale, and wherein:

FIG. 1 illustrates a block diagram of a semiconductor device including a control circuit and a series of nonvolatile memory elements, in accordance with example embodiments of the present invention;

FIG. 2A illustrates a schematic diagram of a conventional two-dimensional NAND structure, in accordance with example embodiments of the present invention;

FIG. 2B shows a conventional three-dimensional application of a two-dimensional NAND structure, in accordance with example embodiments of the present invention; and FIGS. 3A, 3B, 4A, and 4B show schematic diagrams of a conventional manufacturing process in accordance with example embodiments of the present invention;

FIG. 5 shows a flowchart disclosing operations to improve array efficiency of, for example, a nonvolatile memory device, in accordance with example embodiments of the present invention;

FIGS. 6A and 6B show diagrams illustrating a top poly cut, in accordance with example embodiments of the present invention;

FIGS. 7A and 7B show diagrams illustrating the top poly cuts filled with oxide in accordance with example embodiments of the present invention;

FIGS. 8A, 8B, 9A, and 9B show diagrams illustrating advantages of the top poly cut process in accordance with example embodiments of the present invention;

FIGS. 10A, 10B, and 10C show diagrams illustrating the ONO Stack/Poly Channel in accordance with example embodiments of the present invention;

FIGS. 11A and 11B show diagrams illustrating the memory device including Bit Lines in accordance with example embodiments of the present invention;

FIGS. 12A and 12B show diagrams illustrating the memory device comprising a plurality of SSLs in accordance with example embodiments of the present invention;

FIG. 13 shows a memory device including a WL decoder area and a common select line (CSL);

FIG. 14 shows a diagram illustrating a method for using SSL to decode BL in accordance with example embodiments of the present invention;

FIGS. 15A and 15B show diagrams illustrating no WL bridge or BL bridge concerns in accordance with example embodiments of the present invention; and FIGS. 16A and 16B show diagrams illustrating a repair scheme in accordance with the present invention.

DETAILED DESCRIPTION

Some embodiments of the present invention will now be described more fully hereinafter with reference to the accompanying drawings, in which some, but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

As used here, a "non-volatile memory device" refers to a semiconductor device which is able to store information even when the supply of electricity is removed. Non-volatile memory includes, without limitation, Mask Read-Only Memory, Programmable Read-Only Memory, Erasable Programmable Read-Only Memory, Electrically Erasable Programmable Read-Only Memory, and Flash Memory.

As used herein, a "substrate" may include any underlying material or materials upon which a device, a circuit, an epitaxial layer, or a semiconductor may be formed. Generally, a substrate may be used to define the layer or layers that underlie a semiconductor device or even forms the base layer of a semiconductor device. The substrate may include one or any combination of silicon, doped silicon, germanium, silicon germanium, semiconductor compounds, or other semiconductor materials.

Turning now to FIG. 1, a block diagram of an example semiconductor device 100 is provided. This example semiconductor device includes both a control circuit 102 and a series of nonvolatile memories 104. The control circuit 102 communicates with each of the nonvolatile memories 104 and is configured to direct the read, program, erase, and other operations applied to the memory elements. In turn, each nonvolatile memory 104 may include a matrix of memory cells arranged in rows and columns. For example, FIG. 2A shows a schematic diagram of a conventional two-dimensional NAND structure.

Each memory cell in the matrix includes a transistor structure having a gate, a drain, a source, and a channel defined between the drain and the source. Each memory cell is located at an intersection between a word line and a bit line, wherein the gate is connected to the word line, the drain is connected to the bit line, and the source is connected to a source line, which in turn is connected to common ground. The gate of a conventional flash memory cell generally comprises a dual-gate structure, including a control gate and a floating gate, wherein the floating gate is suspended between two oxide layers to trap electrons that program the cell. In some embodiments, each nonvolatile memory 104 may include a three-dimensional memory. FIG. 2B shows a conventional three-dimensional application of the two-dimensional NAND structure shown in FIG. 2A.

Conventional Architecture

As can be seen in FIG. 2A, in the conventional NAND Flash architecture, the cells are connected in series (e.g., typically in groups of 16 or 32). An example matrix of memory cells is illustrated. This matrix of memory cells is part of a block within a nonvolatile memory device (such as one of nonvolatile memories 104 described in connection with FIG. 1, above). Each block of the nonvolatile memory device includes a plurality of word lines (of which "WL" . . . and "WL$_n$" are illustrated in FIG. 2A) that intersect a sequence of odd and even bit lines. In FIG. 2A, the illustrated portion of the block illustrates one odd bit line ("BL$_O$") and two even bit lines (BL$_e$). A memory cell is located at each intersecting point of a word line and a bit line. Because there are n word lines and three bit lines shown, FIG. 2A illustrates 3n total memory cells.

Two selection transistors are placed at the edges of the stack, to ensure the connections to ground (through MGSL) and to the BL (through MSSL). When a cell is read, its gate is set to 0V, while the other gates of the stack are biased with a high voltage (typically 4-5 V), so that they work as pass-transistor, regardless of their threshold voltage. An erased NAND Flash cell has a negative threshold voltage. In comparison, a programmed cell has a positive threshold voltage which will be, in any case, less than 4V. In practice, driving the selected gate with 0V, the series of all the cells will sink current if the addressed cell is erased, otherwise no current is sunk if the cell is programmed.

FIG. 2B shows a conventional three-dimensional application of the two-dimensional NAND structure shown in FIG. 2A. As shown, each NAND layer, one of which is shown in FIG. 2A, comprises a plurality of word lines (of which "WL0" . . . and "WL23" are illustrated in FIG. 2B) that intersect a sequence of bit lines (of which "BL<p>" . . . "BL<q>" are illustrated in FIG. 2B). Moreover, each NAND layer comprises a single string select line ("SSL") ("SSL<0>", "SSL<1>", and "SSL<7>" are illustrated in FIG. 2B).

Conventional Manufacturing Process

FIGS. 3A, 3B, 4A, and 4B show a conventional manufacturing process. First, a substrate is provided. FIG. 3A shows a cross sectional view of a substrate and FIG. 3B shows a top view of the substrate. Once the substrate is provided, as shown in FIG. 4A, a plurality of interleaved conductive layers and insulating layers may then be provided.

Once the layers are provided, deep slit etching utilized in, for example, a gate replacement process may lead to increasing the pitch as subsequent layers are added. The increasingly high pitch results in an inefficient array density when attempts are made to increase the number of layers in the memory device. That is, in conventional manufacturing processes, deep slit etching may be forced to increase the top layer pitch as the layer number is increased. The close-to-90-degree taper angle required for any cost advantage results in challenging etch and fill steps in manufacturing.

Top Layer Poly Cut Process

As such, a new process is provided wherein only the top layer is cut. This process reduces or eliminates the process window limitation, thus allowing higher stacking of layers and a more efficient array density. For example, in accordance with the present invention, the top layer may be used to control the entire NAND string. That is, only one switch may be necessary to turn on or turn off the NAND string.

Turning now to FIG. 5, a flowchart is illustrated that describes operations performed to improve array efficiency of, for example, a nonvolatile memory device, in accordance with example embodiments of the present invention. In operation 502, a substrate is provided. FIG. 3A, which shows a cross-sectional view, and 3B, which shows a top-view, illustrate the providing of a substrate 300. In some embodiments, the substrate may be any of an n-type, un-doped, or a p-type substrate.

In operation 504, conductive layers (e.g., poly silicon) are provided interleaved with insulating layers. That is, an Oxide Poly deposit process may be performed. FIGS. 4A and 4B illustrate the providing of the conductive layers 405 interleaved with the insulating layers 410. For example, as shown in the FIG. 4A, the conductive layers 405 may be poly or the like while the insulating layers 410 may be oxide or the like.

In operation 506, etching may be performed. For example, FIGS. 6A and 6B show a top poly cut 610. Specifically, FIG. 6A shows a top poly cut that is achieved by etching the top layer 405a. In some embodiments, the top non-conductive layer may also be cut, for example, so long as no other conductive layers are cut. In some embodiments, the cut may be less than 100 nm, and more close to 50 nm. In some embodiments, the top layer comprises n−1 cuts, each cut electrically separating two independent portions of the top layer 405. In some embodiments, the independent portions may contain or otherwise include string select lines, which will be discussed below. In some embodiments, each cut may be a depth of equal or near equal to that of the top layer 405a thus not extending into the bottom layers, or only into the first non-conductive layer. In operation 508, the cuts may be filled in with oxide or the like, thus electrically insulating portions of the top conductive layer from each other. FIG. 7A, which shows a cross-sectional view, and 7B, which shows a top-view, illustrate the previously cut poly layer 610 filled with oxide.

Figure 9B:
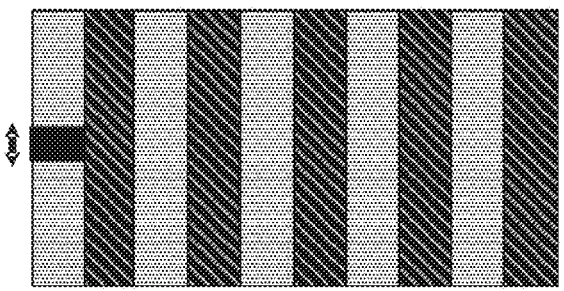
Figure 9A:
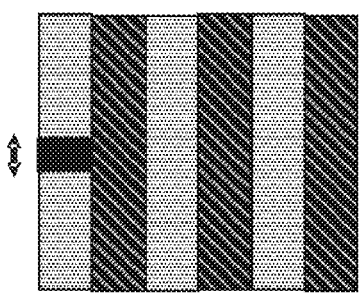
Figure 8B:
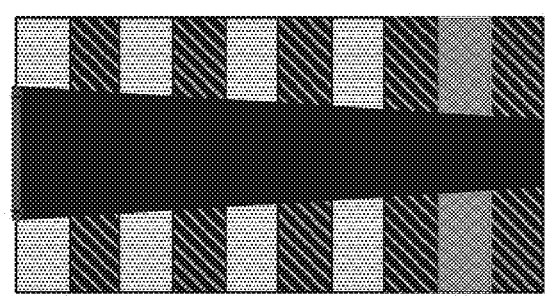
Figure 8A:
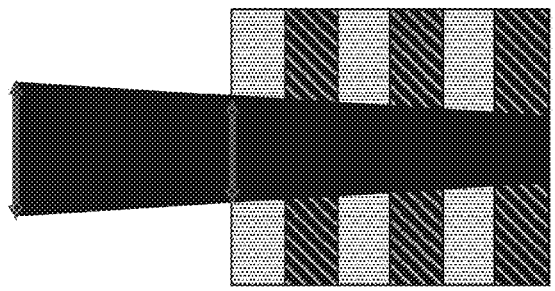

FIGS. 8A-8D illustrate the advantages of the top poly cut 610. FIG. 8A illustrates a conventional WL slit for gate replacement with a low stack and FIG. 8B illustrates a conventional WL slit for gate replacement with a higher stack. As shown, a larger rule requirement may be required for a higher stack due to the tapered etch. Accordingly, due to the tapered etch, a higher stack results in more space being necessary and thus inefficiency. FIG. 9A shows a cut of only the top poly layer in accordance with the present invention for a lower stack and FIG. 9B shows a cut of only the top poly layer in accordance with the present invention for a higher stack. As shown in FIGS. 9A and 9B, only the top conductive layer is cut in both the lower stack and the higher stack, which may result in increased efficiency.

In operation 510, an etching process may provide vertical holes or vertical channels. Once the vertical channels are provided, the vertical channels may be filled in. The filled vertical channels or the ONO stack may be any one of an insulator/trapping or trapping/insulator combination. In some embodiments, the vertical channel is filled with any one of a poly only or poly/insulator combination. As shown in FIGS. 10A and 10B, a plurality of vertical channels may be arranged orthogonal to the plurality of layers. Specifically, FIG. 10A illustrates a cross-sectional view of the memory device whereas FIG. 10B illustrates a top view. FIG. 10C shows a detail illustration of the ONO Stack/Poly Channel. In some embodiments, each of the plurality of channels may comprise a string of memory cells, for example, a NAND string or the like. Each of the plurality of strings of memory cells may then be coupled to a bit line, an SSL and one or more word lines.

In operation 512, bit lines (BLs) may be provided. FIG. 11A illustrates a cross-sectional view of the memory device including BL 1105. FIG. 11B shows a top view of the memory device and includes BLs 1105a-1105n. Furthermore, FIG. 11B illustrates SSLs 1110a-1110n. The bit line may be decoded using the SSL. FIG. 12A shows a schematic diagram of a three-dimensional NAND structure according to an embodiment of the present invention. As shown, the three-dimensional architecture according to an embodiment of the present invention comprises a plurality of word lines (of which WLn-1 . . . and WLn are illustrated in FIG. 12B) that intersect a sequence of bit lines (of which 1105a-1105n are illustrated in FIG. 12B).

In some embodiments, a plurality of SSLs may be provided. For example, FIG. 12A, which illustrates a top view of a 3D memory structure, shows a plurality (e.g., 3) of SSLs (of which SSL1, SSL(n-1) and SSL(n) are illustrated) and FIG. 12B, which illustrates a cross-sectional view, shows a plurality (e.g., 2) of SSLs (of which SSL1 and SSLn are illustrated). Here, each NAND layer comprises a plurality of word lines (of which WL1 . . . WLn-1, and WLn are illustrated) that intersect a sequence of bit lines (of which BL1 . . . BLn are illustrated). While the words lines of each layer are electrically connected (i.e., each WLn is the same voltage), the SSLs are not (i.e. SSLn(0) and SSL(1) are not electrically connected).

FIG. 13 shows a memory device including a WL decoder area and common select line (CSL). In some embodiments, the CSL may be comprised of poly, metal or the like. FIG. 14 shows a method for using SSL to decode BL. Specifically, selecting SSL2 1405 (and not SSL1 1410 or SSL3 1415) allows the decoding of BL 1105a. That is, voltage from the bit line 1105a goes into the vertical channel 1420 and the substrate 300 and then into the CSL 1310.

As shown in FIG. 15A, which shows a cross-section view of a potential failure mode, and 15B, which shows the top view, the present invention presents no WL bridge or BL bridge concerns. The only failure mode is BL open. That is, during read operation, current may flow through, for example, the metal BL on top of the array and vertical channel to the substrate and CSL as shown in FIG. 14. If the metal BL on top is broken or vertical channel etching is not deep enough, BL open takes place and data stored in the memory cell cannot be read correctly. FIGS. 15A and 15B show the failure mode. FIG. 16A shows a repair scheme for BL open. FIG. 16A illustrates an embodiment with a few BL open, BL repairs may be done in accordance with the present invention. FIG. 16B shows an embodiment where many BLs are open, and as such, BL repair may be done as a block repair in accordance with the present invention.

Although some embodiments of the present invention comprise or utilize a NAND flash memory device, embodiments of the present invention may comprise or utilize other nonvolatile semiconductor devices, such as NOR flash memory, ROM, or the like.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A structure of a memory device, the structure of the memory device comprising:
   a substrate; and
   a 3D array of nonvolatile memory cells, the 3D array including:
   a plurality of conductive layers, separated from each other by insulating layers, the plurality of conductive layers comprising a top layer, the top layer comprising n string select lines (SSLs) and one or more bottom layers,
   wherein the top layer further comprises n-1 cuts, each cut electrically separating two SSLs, wherein each cut is cut to a depth of the top layer thus not extending into the bottom layers.

2. The structure of the memory device of claim 1, further comprising:
   a plurality of vertical channels arranged orthogonal to the plurality of layers, each of the plurality of channels comprising a string of memory cells, each of plurality of strings coupled to a bit line, an SSL and one or more word lines.

3. The structure of the memory device of claim 1, further comprising:
   a control circuit configured to decode bit lines utilizing the SSLs.

4. The structure of the memory device of claim 1, further comprising:
   a common select line (CSL) on each side of the bit lines, wherein the CSL is formed with any one of polysilicon, Epi, or metal.

5. The structure of the memory device according to claim 1, wherein the memory device is one of a non-volatile memory device, an embedded memory device, a floating gate memory device, or a charge trapping memory device.

6. The structure of the memory device according to claim 1, wherein the substrate is one of an n-type, un-doped, a p-type, or a triple well structure including n-well, p-well, and deep N-well.

7. The structure of the memory device according to claim 1, wherein the ONO stack could be any one of an insulator/trapping or trapping/insulator combination and the channel is filled with any one of a poly only or poly/insulator combination.

8. The structure of the memory device according to claim 1, wherein the apparatus may be utilized to control a ROM or NAND memory device.

9. The structure of the memory device of claim 1, wherein the memory device is a non-volatile memory device comprises a flash memory.

10. The structure of the memory device of claim 1, wherein the memory device is a non-volatile memory device comprises a NAND flash memory.

11. A non-volatile memory device comprising:
    a substrate; and
    3D array of nonvolatile memory cells, the 3D array including:
    a plurality of conductive layers, separated from each other by insulating layers, the plurality of conductive layers comprising a top layer, the top layer comprising n string select lines (SSLs) and one or more bottom layers,
wherein the top layer further comprises n−1 cuts, each cut electrically separating two SSLs, wherein each cut is cut to a depth of the top layer thus not extending into the bottom layers.

12. The non-volatile memory device of claim 11, further comprising:
a plurality of vertical channels arranged orthogonal to the plurality of layers, each of the plurality of channels comprising a string of memory cells, each of plurality of strings coupled to a bit line, an SSL and one or more word lines.

13. The non-volatile memory device of claim 11, further comprising:
a control circuit configured to decode bit lines utilizing the SSLs.

14. The non-volatile memory device of claim 11, further comprising:
a common select line (CSL) on each side of the bit lines, wherein the CSL is formed with any one of polysilicon, Epi, or metal.

15. The non-volatile memory device according to claim 11, wherein the substrate is one of an n-type, un-doped, a p-type, or a triple well structure including n-well, p-well, and deep N-well.

16. The non-volatile memory device according to claim 11, wherein the ONO stack could be any one of an insulator/trapping or trapping/insulator combination and the channel is filled with any one of a poly only or poly/insulator combination.

17. The non-volatile memory device according to claim 11, wherein the non-volatile memory device comprising a flash memory.

18. The non-volatile memory device according to claim 11, wherein the non-volatile memory device comprising a NAND flash memory.

19. A method of manufacturing a semiconductor device comprising:
providing a substrate;
forming a plurality of conductive layers, separated from each other by insulating layers, the plurality of conductive layers comprising a top layer, the top layer comprising n string select lines (SSLs) and one or more bottom layers,
etching the top layer to comprise n−1 cuts, wherein each cut is cut to a depth of the top layer and not extending into the bottom layers; and
filling the n−1 cuts with insulating material, wherein the etching and filling each cut forms the SSLs along the top layer.

20. The method according to claim 19, further comprising:
providing a plurality of vertical channels arranged orthogonal to the plurality of layers, each of the plurality of channels comprising a string of memory cells, each of plurality of strings coupled to a bit line, an SSL and one or more word lines.

21. The method according to claim 19, further comprising:
decoding one or more bit lines utilizing the SSLs.

22. The method according to claim 19, wherein the semiconductor device is one of a non-volatile memory device, an embedded memory device, a floating gate memory device, or a charge trapping memory device.

23. The method according to claim 19, wherein the substrate is one of an n-type, un-doped, a p-type, or a triple well structure including n-well, p-well, and deep N-well.

* * * * *